US011060179B2

(12) United States Patent
Vetter

(10) Patent No.: US 11,060,179 B2
(45) Date of Patent: Jul. 13, 2021

(54) BIPOLAR ARC-COATING METHOD

(71) Applicant: Oerlikon Surface Solutions AG, Pfäffikon, Pfäffikon (CH)

(72) Inventor: Joerg Vetter, Bergisch Gladbach (DE)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 0 days.

(21) Appl. No.: 15/566,706

(22) PCT Filed: Apr. 4, 2016

(86) PCT No.: PCT/EP2016/057352
§ 371 (c)(1),
(2) Date: Oct. 14, 2017

(87) PCT Pub. No.: WO2016/184596
PCT Pub. Date: Nov. 24, 2016

(65) Prior Publication Data
US 2018/0080118 A1 Mar. 22, 2018

(30) Foreign Application Priority Data
Apr. 15, 2015 (DE) .................... 10 2015 004 856.2

(51) Int. Cl.
C23C 14/32 (2006.01)
C23C 14/00 (2006.01)
(52) U.S. Cl.
CPC ........ C23C 14/325 (2013.01); C23C 14/0021 (2013.01)

(58) Field of Classification Search
CPC .................................................... C23C 14/325
USPC ..................................................... 204/298.41
See application file for complete search history.

(56) References Cited

U.S. PATENT DOCUMENTS

| 5,103,766 | A | * | 4/1992 | Yoshikawa | ....... H01J 37/32055 118/723 VE |
|---|---|---|---|---|---|
| 5,814,195 | A | * | 9/1998 | Lehan | .................. C23C 14/352 204/192.12 |
| 6,350,356 | B1 | * | 2/2002 | Welty | .................... C23C 14/325 204/298.11 |
| 6,361,663 | B1 | | 3/2002 | Berthold et al. | |
| 2007/0000772 | A1 | * | 1/2007 | Ramm | .................. C23C 14/024 204/192.38 |
| 2008/0173536 | A1 | * | 7/2008 | Ramm | .................. C23C 14/325 204/192.12 |
| 2009/0148599 | A1 | * | 6/2009 | Ramm | .................. C23C 14/325 427/255.5 |
| 2013/0302596 | A1 | * | 11/2013 | Vetter | ................. C23C 14/0068 428/336 |

FOREIGN PATENT DOCUMENTS

| WO | 02070776 A1 | 9/2002 |
|---|---|---|
| WO | 03057939 A2 | 7/2003 |
| WO | 2006099760 A2 | 9/2006 |

* cited by examiner

Primary Examiner — John J Brayton

(57) ABSTRACT

An electric-arc evaporation method for coating surfaces, wherein at least two active consumption targets are used in the method, characterized in that the consumption targets are alternately connected as a cathode and an anode during the coating process.

13 Claims, 4 Drawing Sheets

BIPOLAR ARC-COATING METHOD

BACKGROUND OF THE INVENTION

In arc evaporation, also referred to as electric arc evaporation, a conductive solid body is used as a material supply. This so-called target is operated as a cathode, i.e. a negative voltage is applied compared to an anode surface. The cathode and anode are disposed in a coating chamber. The coating chamber is evacuated for the coating process. Then, electrons in the form of an electric arc (hereinafter also referred to as arc or spark) are drawn out of the cathode. Substantially, the electrodes migrate to the anode surface. The ignition of the electric arc may take place in different ways. For example, an ignition finger, which is known to the person skilled in the art, may be used for this purpose. At the point where the electrons are drawn from the target, at the so-called electron spot, a considerable energy input occurs which causes the target material to transition into the vapor phase. During the process, various means are used to take care that this spot, if possible, does not prefer any point of the target surface but constantly dances across it. This may be accomplished with suitable magnetic fields, for example.

A high percentage of the evaporated material is ionized, so that it can be accelerated, by means of a negative bias applied to substrates to be coated, for example, towards these substrates. This results in the substrates being coated, wherein the density of the layer may be very high. Such a method is also referred to as arc evaporation or electric arc evaporation. So-called spatters are a phenomenon accompanying arc evaporation. These are larger molten amounts of material that spontaneously detach from the target surface due to the sudden energy input. If they deposit on the substrates to be coated, this results in a considerable roughness of the coating.

Arc evaporation is also frequently carried out as a reactive process. In the process, a so-called reactive gas, such as nitrogen or oxygen, is introduced into the chamber. En route to the substrates to be coated, the ions then react with the reactive gas so that a compound deposits on the substrates. In part however, this reactive gas already reacts with the target surface itself. Substantially, this does not present any problems if the compound produced also forms an electrically conductive material.

However, it becomes problematic if the compound produced forms an electrically insulating material and the insulating layer forming on the target becomes too thick, so that no electrons can be drawn out of the target any longer. A person skilled in the art refers to these cases as a poisoning of the target surface, which results in the coating process first becoming unstable. In particular, there is a risk of the electron spot getting stuck at a point of the target, locally resulting in a considerable and permanent material removal so that the target literally gets a hole.

There are various measures against such a target poisoning. In WO06/099760, Ramm et al, found that a pulsed operation superposed over a direct voltage largely prevents such a target poisoning, for example.

The pulsing of arc sources has been known for some time from the prior art; for example, WO02/070776 very generally describes the pulsing of spark sources to deposit various superhard layers, such as TiSiN.

WO 03/057939 describes a spark source in which the are is ignited via a pulsed high-voltage supply and the spark is fed by a pulsed high-current supply. In this case, the spark is operated discontinuously. The starting materials are metallic conductive cathodes, conductive alloys and, additionally, carbon or evaporable semiconductors. Due to the very complex geometry of the target body, however, the arc source shown here requires much effort in fabrication and is expensive in operation, particularly for cathode materials that are difficult to process.

U.S. Pat. No. 6,361,663 describes an arc source with a cathode made of an electrically conductive material, which is operated in a pulsed or modulated pulsed manner with peak currents of up to 5 kA and a basic current of 100 A, for example. Due to its construction with a magnetic tunnel and an anode completely enclosed by the cathode, this source is also complex to fabricate and expensive in operation.

However, the issue that during the reactive deposition, which results in electrically insulating materials, the anode is also coated and thus also forms an electrically insulating surface over time, is common to the entire prior art. Thus, the coating process in turn becomes unstable.

One countermeasure known in the prior art is to make the surface of a heating coil the anode. In that case, it is possible, by rapid cyclic heating, to cause at least parts of the insulating materials deposited on the anode, i.e. the heating coil, to flake off from the latter and thus expose the electrically conductive surface. However, this process is rarely complete, so that, substantially, a non-reproducible anode surface is provided.

There is therefore a need to propose a method in which a permanent insulative covering of the anode surface is not produced over the course of the coating process.

SUMMARY OF THE INVENTION

According to the invention, the object is achieved by at least two targets being provided for the coating process. During coating, alternately, one of the targets is then connected as the material-providing cathode and the other target as the anode. Preferably, the switchover is carried out so rapidly that the plasma forming during coating is not extinguished and the electric arc to be formed over the current cathode is able to form easily. According to the invention, the occurrence of an anode loss is prevented by means of at least two active consumption targets alternately connected as an anode and a cathode. The coating process is thus stabilized.

With respect to the method according to the invention, it is clear that, while a target is connected as an anode, coating material, i.e. possibly an electrically insulating layer, forms on its surface. Therefore, care should be taken that the shift from the anode to the cathode takes place sufficiently frequently in order not to let this electrically insulating layer become too thick. Surprisingly, it was found that a very thin insulating layer on the target surface is conducive to the coating process. In particular, the electrode spot appears to tend rather to migrate towards locations in which a very thin insulating layer is already present. This is conducive to a uniform removal of the target surface.

Inter alia, DC, DC pulsed ruin/max, high-current pulsation or even the superposition of several pulse sources are possible manners of operation.

Cylindrical, rectangular, circular or other suitable geometries may be selected as targets.

For example, mechanical triggers, trigger electrodes or the support by lasers is conceivable for igniting the electric arc(s).

In addition to the known working gases argon, helium and the like, the known reactive gases, such as oxygen, nitrogen and acetylene, may be primarily used as process gases. However, all other oxygen-containing, nitrogen-containing and carbon containing gases, or also silicon-containing gases, such as slaves, are also conceivable.

BRIEF DESCRIPTION OF THE DRAWINGS

The invention is explained in more detail below with reference to illustrations and descriptions, wherein the illustrated embodiments are to be considered examples and are not intended to have any limiting character whatsoever.

DETAILED DESCRIPTION OF THE INVENTION

The following table summarizes the terms used in the FIGS. 1 to 4:

| No.: | Name in description |
| --- | --- |
| 1 | Arc evaporator 1 with target material A |
| 2 | Arc evaporator 2 with target material A or B |
| 3 | Electron flow |
| 4 | DC current generator |
| 5 | Bipolar pulse converter |
| 6 | Anode switch for chamber and/or auxiliary anode |
| — | Mode of operation 1, 2 |
| — | Switchover as cathode, ignition arc evaporator 1 |
| — | Switchover as cathode, ignition arc evaporator 2 |
| — | $t_{off}$: Switchover pause |
| — | Voltage |
| — | Anode current |
| — | Cathode current |

Figure 1:
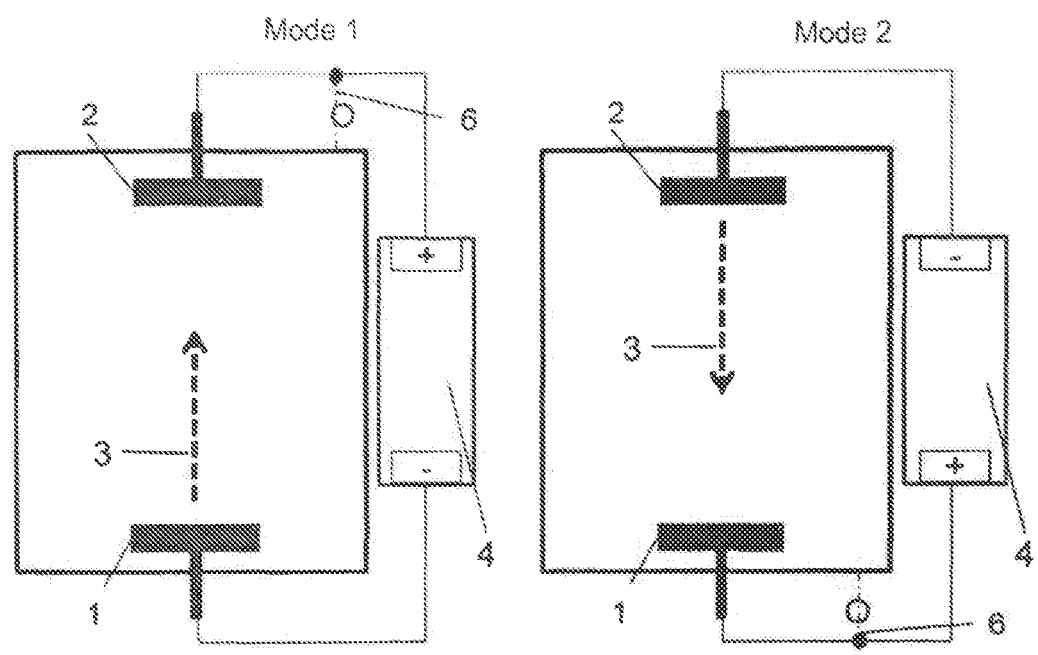
FIG. 1: Schematic representation for switching the bipolar manner of operation of arc sources with suitable contactors or semiconductor switches.

FIG. 1 schematically illustrates an assembly of arc evaporators 1 and 2 disposed opposite to each other, which depicts the resulting electron flow 3 from the cathode towards the anode. In the left half of the image, the manner or mode 1 of operation is shown with the arc evaporator 1 connected as the material-providing cathode and the arc evaporator 2 as the anode, and in the right half of the image in the reverse mode of operation, i.e. mode 2, with the arc evaporator 2 connected as the material-providing cathode and the arc evaporator 1 as the anode. In both modes of operation, current is supplied by means of a DC current generator 4.

in a preferred embodiment, the current supply of the cathode in the respective mode of operation, as described above, may also take place in the respective periods $t_1$ to $t_n$ as a unipolar pulsed DC current supply with a minimum and a maximum current, or even as a high-current pulsation with different amplitudes for the various periods.

Figure 2:
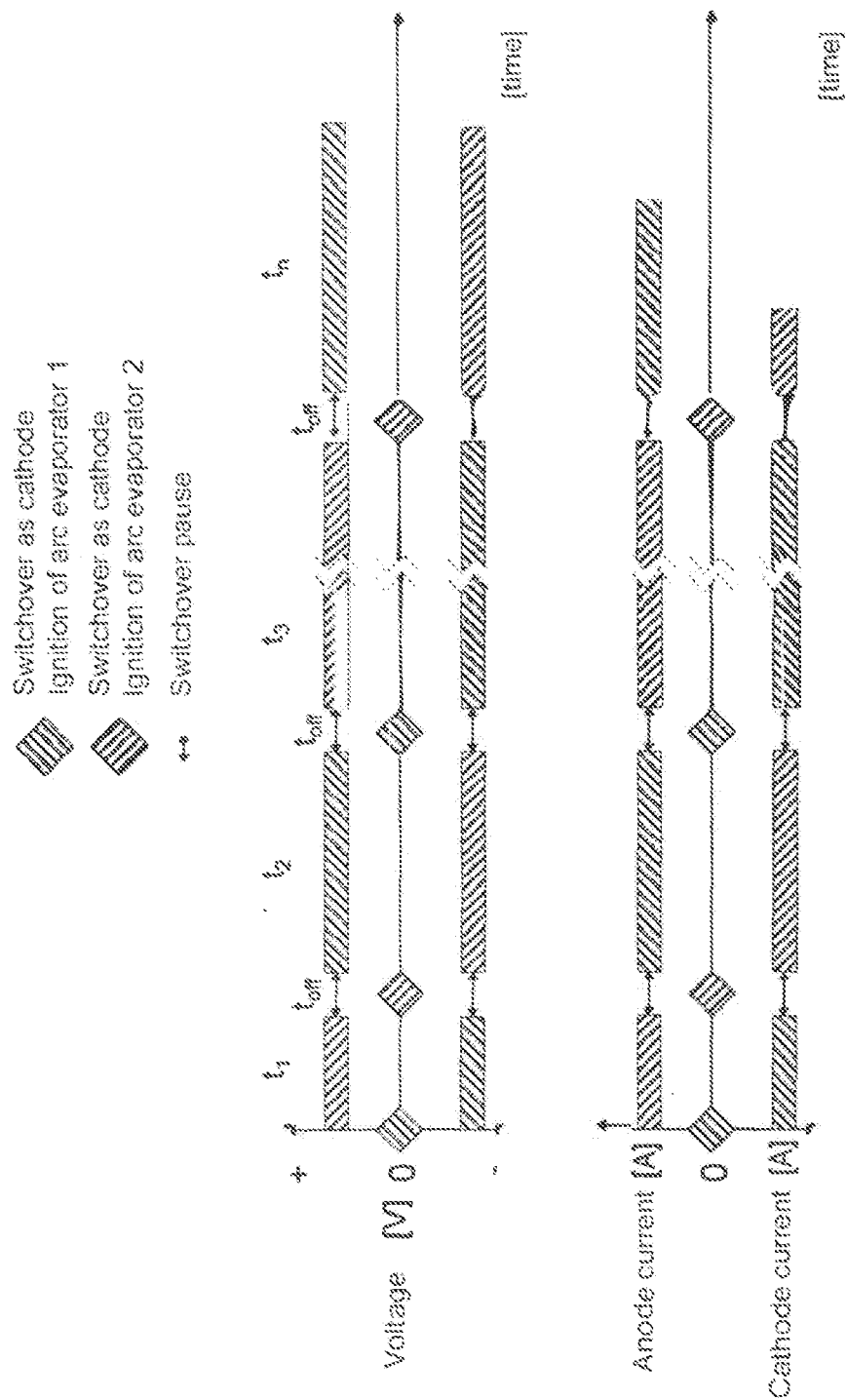
FIG. 2: Process schematic for bipolar operation of arc sources.

A manner of operation of the method according to the invention is symbolically shown in FIG. 2. Here, a possible sequence of the voltages and corresponding measured currents on two arc evaporators; which are alternately connected as a cathode or an anode for a certain period $t_1$ to $t_n$, is illustrated over several switchover processes. The periods $t_1$ to $t_n$ cited as examples may be the same or different with regard to their duration. However, the duration in one mode of operation, also referred to as mode, has to have the same length for the arc source respectively connected as a cathode or anode. The change of the manner of operation of an arc evaporator from cathode to anode or vice versa is indicated as a switchover process over a period $t_{off}$, wherein possibly required ignition processes of the cathode may take place during this switchover process.

As another embodiment, mention, may be made in this case of selecting an arbitrary sequence of periods for a mode of operation which however, repeat periodically over the total coating time $t_{ges}$. For example, a sequence of $t_1$-$t_2$-$t_3$, under the condition $t_1 < t_2 < t_3$, may constantly repeat itself.

Further, FIG. 2 schematically shows that the negative arc voltage of the arc evaporator 1 connected as the material-providing cathode delivers a corresponding cathode current over the period $t_1$. Conversely, a positive voltage on the arc evaporator 2 connected as an anode, or a corresponding anode current, can be measured in the same period. Naturally, the absolute values of the voltages on the cathode and anode need not be identical and with reversed signs. This also applies to the current values on the cathode or anode.

A special embodiment to be cited is that the selected coating settings, such as the cathode current and/or the bias voltage can be different for the arbitrary periods $t_1$ to $t_n$, and thus, the level of the respective voltages and currents at the cathodes or anodes can also be different for the respective periods $t_1$ to $t_n$.

Further, it is also inherent to the present invention that the at least two arc evaporators used are equipped with target materials that may be identical or also different in particular, the target materials used may in this case have one or more elements in the form of pure elements, alloys or also ordered phases, such as stoichiometric compounds. This means that one or more targets may be composed of, in each case, one or more metals, metal alloys, intermetallic phases and the like, as well as, equivalent therewith, metal non-metal compounds or metal non-metal composites or, equivalent therewith, one or more non-metals, their compounds or a composite thereof. This is connected to the fact that the two or more arc evaporators can be operated with different arc currents, depending on their target materials.

With respect to the inventive bipolar manner of operation of the at least two arc evaporators in a cathodic or anodic operation, the following remarks pertaining to the operation times in the respective mode of operation may be made.

Particularly in the case of reactive arc processes, the spark movement on the target is of major significance, which, however, is affected by a series of factors. Here, as possible influencing parameters, mention may be made by way of example of, inter alia, the selection and quantity of the reactive gases, the process pressure or the partial pressures, the type and, properties of the target material used, the magnetic system of the arc evaporator used, the level of the DC or pulsed target current and, in particular the shape and size of the target.

The choice of a lower time limit for any time interval of a mode of operation $t_1$ to $t_n$ therefore strongly depends on the above-mentioned factors, and can therefore be understood substantially to mean that the spark, on the target surface of an arc evaporator in cathodic operation, has passed over the target surface once.

Given an optimal process design, the process may be kept stable by means of a kind of self-cleaning effect of the target surface, i.e. a removal of the insulating components forming in the reactive atmosphere. However, the existing problems with carrying out a stable process during the deposition of insulating layers lie in the fact that the insulating reaction products deposit on the anode surface during the coating process. Thus, the electrons are increasingly difficult to remove as the process time increases, until a complete loss of the anode occurs. In particular, this is the case at moderate to low process temperatures, e.g. in the coating of temperature-sensitive substrate materials, such as 100Cr6 steels, in which the anode effect of a radiation heater cannot be used because it is inactive during the process. In that case, the inventive bipolar manner of operation is able, by means of two or more arc evaporators, to constantly offer a conductive anode for electron removal, because the anode surface was "arced free", i.e. cleaned, by the cathodic operation in the previous time interval. That is the reason that the upper time limit for $t_1$ to $t_n$ for the cathodic or anodic operation is limited by the duration caused by the formation of an insulating, layer on the target surface connected as an anode that is no longer capable of breaking down or igniting and thus precludes a re-ignition as the material-providing cathode.

However, it may also happen that process settings have to be chosen that favor the formation of insulating material on the cathode surface, e.g. due to the use of special target materials. The continuous target poisoning produced thereby usually causes an increase in the arc voltage of the cathode, which is finally capped by the current supply source. In such a case, the upper time limit for $t_1$ to $t_n$ for cathodic operation is defined by the highest permissible arc voltage being reached.

Accordingly, the respective lower or upper limits for the time intervals $t_1$ to $t_n$ are strongly dependent on the above-mentioned process parameters and, not least, influenced by the type of the substrates to be coated, the charge density and geometric factors.

In addition to the above-described mechanical triggers, trigger electrodes or lasers, other ignition tools may be used in the method according to the invention for igniting the electric arc, such as: electrical primary and secondary sources, such as, inter alma, by means of high-voltage ignition via capacitors or the like, or also an ignition by secondary plasmas caused by sputtering, and here particularly HIPIMS, or plasma injection by means of a hollow cathode or the like, for example.

Figure 3:
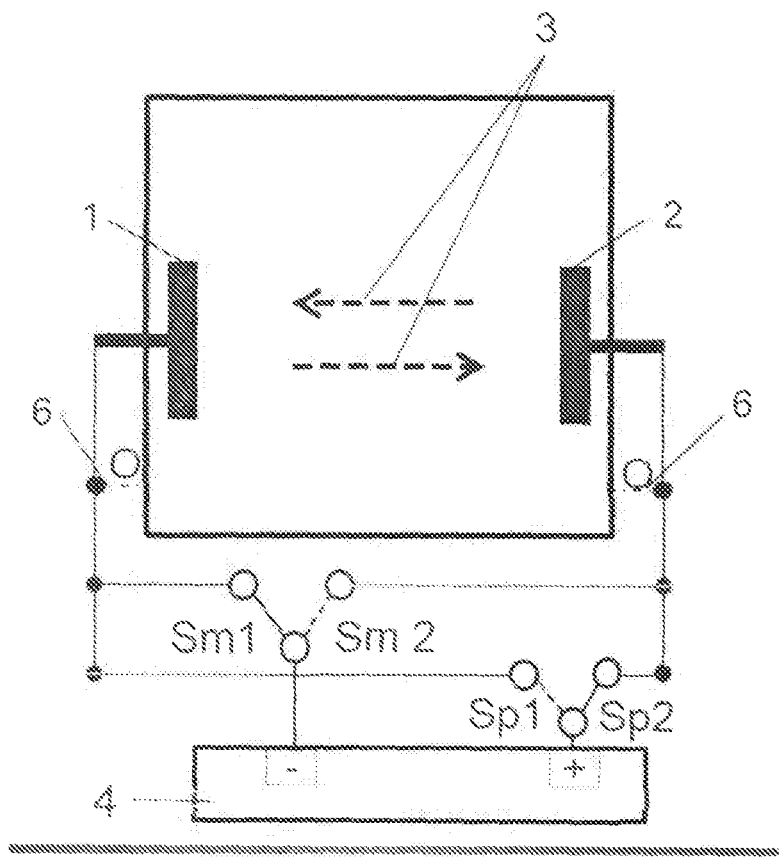
FIG. 3: Schematic representation for switching the bipolar operation of arc sources in a further embodiment with suitable contactors or semiconductor switches.

FIG. 3 schematically shows a simple solution for implementing the bipolar manner of operation by means of switching over the mode of operation of the at least two arc evaporators 1 and 2. The switchover may be realized by means of protective switches, semiconductor switches or the like, if an arc evaporator 1 is connected as a material-providing cathode, the current path from the DC current supply 4 or an alternative pulsed DC current supply is closed via Sm1, and an arc evaporator 2 is linked as an anode to the current source via a switch Sp2. If the mode of operation of an arc evaporator is changed from cathodic to anodic, or for the corresponding second arc evaporator from anodic to cathodic, the switchover process takes place simultaneously at the indicated switching members Sm and Sp, respectively. Accordingly, the current path runs from the negative pole of the current supply 4 via the switching path Sm2 to the arc evaporator 2 (now the cathode), with the link of the arc evaporator 1 (now the anode) to the pole of the current supply being established via the switching path Sp1.

An alternating operation of the arc evaporators, and thus a bipolar arc evaporation process according to the invention, can thus be realized relatively easily.

In a special embodiment, the use, of a bipolar pulse converter S of the DC current supply 4 can be additionally connected during the process. This embodiment is outlined by way of example in FIG. 4. However, it is required in this assembly that the ignitions of the evaporators 1 or 2 as cathodes are synchronized accordingly. In the process, it is important that the switchover of the arc evaporators from the cathodic to the anodic operation or as an inactive evaporator takes place in suitable time intervals.

Figure 4:
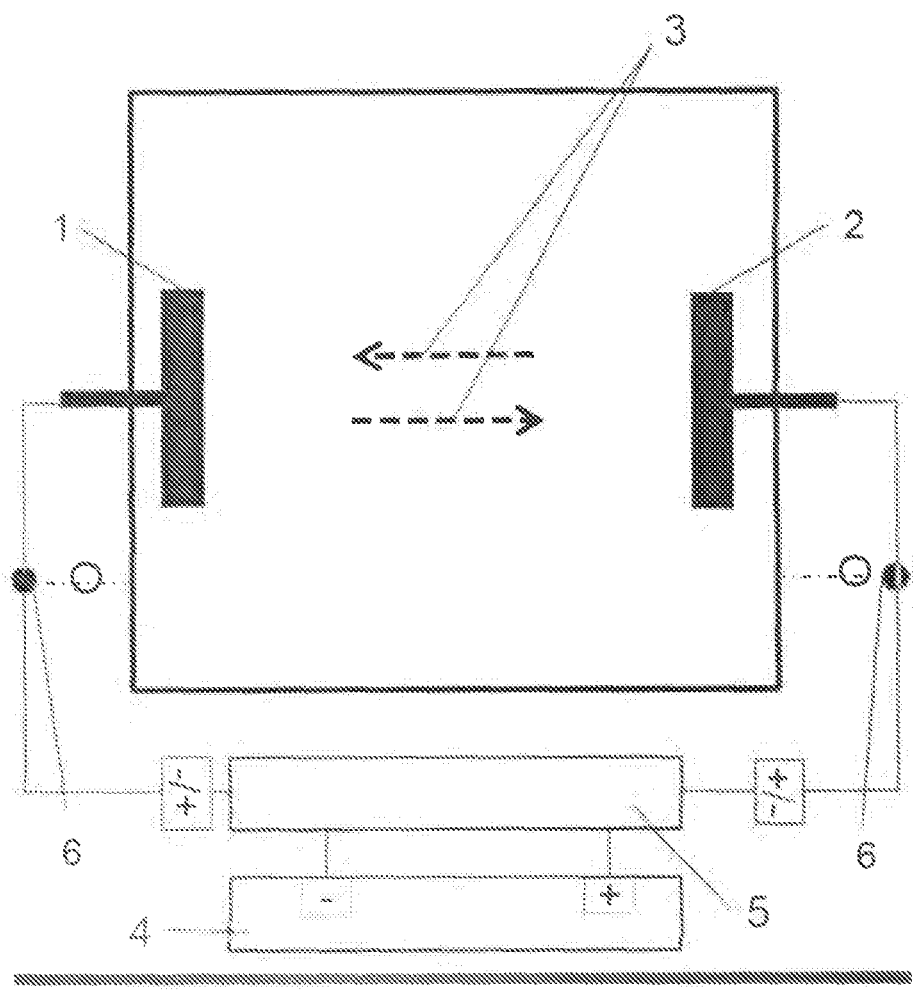
FIG. 4: Schematic representation for switching the bipolar operation of arc sources in a further embodiment with suitable contactors or semiconductor switches as well as an additional bipolar pulse converter.

In a special embodiment, a connection of the current supply with the chamber and/or possible auxiliary anodes is possible for the bipolar manners of operation described above, which may, be useful, in particular, for the ignition of the cathode. This optional connection with the chamber and/or possible auxiliary anodes 6 is schematically shown in FIGS. 1, 3 and 4, and may be carried out, for example, via suitable switches, as described above, for a short time interval (e.g. as ignition tool), or continuously over the respective period $t_1$ to $t_n$.

Surprisingly, it was found that it is particularly advantageous for the present invention if the at least two arc evaporators used, which are connected in different manners of operation, are disposed as closely as possible to each other. Therefore, the arc evaporators may be disposed directly next to each other, for example, or also one on top of the other in the case of using a series evaporator with several arc sources. It is also possible to combine different arc evaporator geometries, i.e. rectangular evaporators and circular and/or cylindrical evaporators, with each other in the manner of operation described above.

Furthermore, it is a particularly preferred feature of the subject invention that the target materials used may differ from one another. Thus, a homogeneous formation of layers on the substrate surface as well as the formation of layer structures, inter alia a nanolayer multi-layer system, may occur due to suitable pulse intervals.

A arc evaporation method for coating surfaces by means of an electric arc was disclosed, wherein at least two active consumption targets are used in the method, the consumption targets being alternately connected as a cathode and an anode during the coating process. One or more reactive gases may be used in the method. The at least one reactive gas may comprise at least one constituent forming an electrically insulating compound with the target material. The at least two different consumption targets may differ in their composition, wherein the buildup of a nanolayer multi-layer system may occur during coating. The at least two active consumption targets may be disposed directly adjacent in such a manner that the plasma forming over one target while the latter is operated as a cathode partially extends across the other target, which at that point in time is operated as an anode.

The invention claimed is:

1. An electric-arc evaporation method for coating surfaces, comprising:
    coating a surface using at least two active consumption targets each positioned on a respective arc evaporator and alternately connected as a cathode and an anode during the coating process, wherein the at least two active consumption targets are disposed directly next to each other or on top of one another, and wherein an alternating connection of the targets as a cathode and an anode during the coating process reduces a thickness of an electrically insulating layer on one of the at least two targets operated as the anode, and the alternating connection takes place as a switchover pause over a period $t_{off}$, wherein ignition processes of the cathode take place during the switchover pause, and the alternating connection is carried out so rapidly that plasma forming during coating is not extinguished, and the rapidly alternating connection enables formation of an electric arc over the cathode, and wherein a current supply of the cathode takes place as a unipolar pulsed DC current supply with a minimum and a maximum current or as a DC current supply under connection of a pulse converter in order to prevent target poisoning on one of the at least two targets operated as the cathode.

2. The method according to claim 1, comprising using at least one reactive gas in the method.

3. The method according to claim 2, wherein the at least one reactive gas comprises at least one constituent forming the electrically insulating layer.

4. The method according to claim 2, comprising using a mixture of gases, wherein at least one gas is a non-reactive working gas.

5. The method according to claim 1, wherein the at least two different consumption targets differ in their composition, and a buildup of a nanolayer multi-layer system occurs during coating.

6. The method according to claim 1, wherein the at least two active consumption targets may be disposed directly adjacent in such a manner that a plasma forming over a first target, while a second target is operated as a cathode, partially extends across the first target, which at that point in time is operated as an anode.

7. The method according to claim 1, wherein, over a total coating time $t_{ges}$, periods $t_1$ to $t_n$ with different lengths are used for respective modes of operation of the at least two consumption targets connected as a cathode or an anode.

8. The method according to claim 7, comprising using the periods $t_1$ to $t_n$ with different lengths for the respective mode of operation of the at least two consumption targets connected as a cathode or an anode in a periodic sequence over the total coating time $t_{ges}$.

9. The method according to claim 1, wherein the at least two consumption targets used have different geometries.

10. The method according to claim 1, wherein the electric arc is ignited by a laser.

11. The method according to claim 1, wherein a lower time limit for any time interval of a mode of operation $t_1$ to $t_n$ takes at least as long until a spark, on a target surface of an arc evaporator in cathodic operation, has passed over the target surface once.

12. The method according to claim 1, wherein an upper time limit for $t_1$ to $t_n$ for a cathodic or anodic operation is limited by a duration caused by formation of an insulating layer on a target surface connected as an anode that is no longer capable of breaking down or igniting and thus precludes a re-ignition as a material-providing cathode.

13. The method according to claim 1, wherein an upper time limit for $t_1$ to $t_n$ for a cathodic or anodic operation of at least one arc evaporator is defined by a maximum arc voltage of the cathode or anode being reached.

* * * * *